US008313887B2

(12) United States Patent
Regan et al.

(10) Patent No.: US 8,313,887 B2
(45) Date of Patent: Nov. 20, 2012

(54) ABLATABLE ELEMENTS FOR MAKING FLEXOGRAPHIC PRINTING PLATES

(75) Inventors: Michael T. Regan, Fairport, NY (US); David B. Bailey, Webster, NY (US); Christine J. Landry-Coltrain, Fairport, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 13/325,093

(22) Filed: Dec. 14, 2011

(65) Prior Publication Data

US 2012/0094104 A1 Apr. 19, 2012

Related U.S. Application Data

(60) Division of application No. 12/838,533, filed on Jul. 19, 2010, now Pat. No. 8,163,465, which is a continuation of application No. 11/782,687, filed on Jul. 25, 2007, now Pat. No. 8,187,794, which is a continuation-in-part of application No. 11/738,536, filed on Apr. 23, 2007, now Pat. No. 8,187,793.

(51) Int. Cl.

| | |
|---|---|
| ***G03F 7/028*** | (2006.01) |
| ***G03F 7/039*** | (2006.01) |
| ***G03F 7/09*** | (2006.01) |
| ***G03F 7/11*** | (2006.01) |

(52) U.S. Cl. ................ 430/271.1; 430/270.1; 430/273.1

(58) Field of Classification Search ............... 430/270.1, 430/271.1, 275.1, 905, 908, 273.1, 926
See application file for complete search history.

(56) References Cited

U.S. PATENT DOCUMENTS

| | | | |
|---|---|---|---|
| 2,892,712 A * | 6/1959 | Plambeck, Jr. | 430/307 |
| 4,060,032 A | 11/1977 | Evans | |
| 5,156,938 A | 10/1992 | Foley et al. | |
| 5,259,311 A | 11/1993 | McCaughey, Jr. | |
| 5,605,780 A | 2/1997 | Burberry et al. | |
| 5,691,114 A | 11/1997 | Burberry et al. | |
| 5,705,310 A | 1/1998 | Van Zoeren | |
| 5,712,079 A | 1/1998 | Robello et al. | |
| 5,719,009 A | 2/1998 | Fan | |
| 5,798,202 A | 8/1998 | Cusher et al. | |
| 5,804,353 A | 9/1998 | Cushner et al. | |
| 5,888,697 A | 3/1999 | Fan | |
| 5,998,088 A | 12/1999 | Robello et al. | |
| 6,090,529 A | 7/2000 | Gelbart | |
| 6,133,402 A * | 10/2000 | Coates et al. | 528/196 |
| 6,159,659 A | 12/2000 | Gelbart | |
| 6,511,784 B1 | 1/2003 | Hiller et al. | |
| 6,521,391 B1 | 2/2003 | Bennett et al. | |
| 6,551,757 B1 | 4/2003 | Bailey et al. | |
| 6,551,762 B1 | 4/2003 | Gaignou et al. | |
| 6,864,039 B2 | 3/2005 | Cheng et al. | |
| 6,989,220 B2 | 1/2006 | Kanga | |
| 7,419,766 B2 | 9/2008 | Kimelblat et al. | |
| 7,790,348 B2 | 9/2010 | Sugasaki | |
| 2003/0012866 A1* | 1/2003 | Harnett et al. | 427/2.11 |
| 2003/0020024 A1 | 1/2003 | Ferain et al. | |
| 2003/0180636 A1 | 9/2003 | Kanga et al. | |
| 2004/0157162 A1 | 8/2004 | Yokota et al. | |
| 2004/0259021 A1 | 12/2004 | Wallace, Jr. et al. | |
| 2005/0227182 A1 | 10/2005 | Ali et al. | |
| 2008/0063980 A1 | 3/2008 | Lungu | |
| 2008/0258344 A1 | 10/2008 | Regan et al. | |
| 2008/0261028 A1 | 10/2008 | Regan et al. | |

FOREIGN PATENT DOCUMENTS

| | | |
|---|---|---|
| EP | 0 562 952 | 9/1993 |
| EP | 0 795 420 | 9/1997 |
| EP | 1 481 800 | 12/2004 |
| EP | 1 481 801 | 12/2004 |
| WO | 99/37482 | 7/1999 |
| WO | 2005/084959 | 9/2005 |

OTHER PUBLICATIONS

A. E. Cherian, et al., "Formation of Nanoparticles by Intramolecular Cross-Linking: Following the Reaction Progress of Single Polymer Chains by Atomic Force Microscopy", J. Am. Chem. Soc., vol. 129, No. 37, 2007 pp. 11350-11351.

* cited by examiner

*Primary Examiner* — Anca Eoff
(74) *Attorney, Agent, or Firm* — J. Lanny Tucker

(57) ABSTRACT

Flexographic printing plates and other relief images can be formed from a laser-ablatable element having a laser-ablatable layer that is from about 300 to about 4,000 μm thickness. The laser-ablatable layer includes a film-forming material that is a laser-laser-ablatable material or the film-forming material has dispersed therein a laser-ablatable material. The laser-ablatable material is a polymeric material that when heated to 300° C. at a rate of 10° C./minute, loses at least 60% of its mass to form at least one predominant low molecular weight product. The laser-ablatable material also comprises at least 0.01 weight % of a depolymerization catalyst that is a Lewis acid or organometallic based catalyst. The element can be imaged by ablation at an energy of at least 1 $J/cm^2$ to provide a relief image.

14 Claims, No Drawings

ABLATABLE ELEMENTS FOR MAKING FLEXOGRAPHIC PRINTING PLATES

RELATED APPLICATION

This is a divisional of prior, commonly assigned U.S. patent application Ser. No. 12/838,533, filed Jul. 19, 2010 now U.S. Pat. No. 8,163,465 by Michael T. Regan, et al, which is a continuation of prior and commonly assigned U.S. patent application Ser. No. 11/782,687, filed Jul. 25, 2007 now U.S. Pat. No. 8,187,794 by Michael T. Regan, et al, which is a Continuation-in-part of and commonly assigned U.S. Ser. No. 11/738,536, filed Apr. 23, 2007 now U.S. Pat. No. 8,187,793 by Michael T. Regan, et al, each of which is incorporated herein by reference in its entirety.

FIELD OF THE INVENTION

This invention relates to laser-ablatable (or laser engraveable) elements that can be used to prepare flexographic printing plates. It also relates to methods of making and using these elements.

BACKGROUND OF THE INVENTION

Flexography is a method of printing that is commonly used for high-volume printing runs. It is usually employed for printing on a variety of substances particularly those that are soft and easily deformed, such as paper, paperboard stock, corrugated board, polymeric films, fabrics, plastic films, metal foils, and laminates. Coarse surfaces and stretchable polymeric films can be economically printed by the means of flexography.

Flexographic printing plates are sometimes known as "relief printing plates" and are provided with raised relief images onto which ink is applied for application to the printing substance. The raised relief images are inked in contrast to the relief "floor" that remains free of ink in the desired printing situations. Such printing plates are generally supplied to the user as a multi-layered article having one or more imageable layers coated on a backing or substrate. Flexographic printing can also be carried out using a flexographic printing cylinder or seamless sleeve having the desired raised relief image.

In order to accommodate the various types of substrates, flexographic printing plates generally have a rubbery or elastomeric nature whose precise properties are adjusted for a particular substrate and printed surface.

Flexographic printing plates have been prepared in a number of ways. Initially, flexographic printing plates were made by cutting a relief image into a sheet of rubber with a knife. An improvement was achieved by forming a mold that could be produced by photo-etched graphics and then by pouring molten rubber into a mold and vulcanizing to form the printing plate. More recently, relief images have been prepared by exposing photosensitive compositions coated on the substrate through a masking element or transparency and then removing non-exposed regions of the coating with a suitable solvent. Various photosensitive compositions are known for this purpose including those containing photosensitive polymers and polymerizable monomers.

U.S. Pat. No. 4,323,636 (Chen) describes the use of thermoplastic elastomeric block copolymers (often sold under the trademark of KRATON®) in combination with photosensitive components in a composition that can be laminated or extruded onto a substrate.

U.S. Pat. No. 5,719,009 (Fan) describes a way to avoid the use of the masking layer to provide a flexographic printing plate. The elements having an ablatable layer disposed over photosensitive layer(s) so that after image ablation, UV exposure of the underlying layer hardens it while non-exposed layer(s) are washed away. DuPont's Cyrel® FAST™ thermal mass transfer plates are commercially available ablatable elements that require no chemical processing, but they do require thermal wicking or wiping to remove the non-exposed areas.

Radiation-sensitive elements having a laser-ablatable mask layer on the surface are known in the art. A relief image can be produced in such elements without the use of a digital negative image or other imaged element or masking device. A masking element is imagewise ablated to form and then placed in contact with a radiation-sensitive element and subjected to overall exposure with actinic radiation (for example, UV radiation). The combined elements are then "developed" to remove the masking element and unexposed regions of the resulting flexographic printing plate. A significant advance in this technique for making flexographic printing plates is described in U.S. Patent Application Publication 2005/0227182 (Ali et al.).

However, there remains a desire in the art to find a way to make flexographic printing plates by direct thermal imaging, thereby avoiding the need for masking elements or devices. Difficulties arise with this approach because most imaging devices have insufficient power to provide sufficient relief depth. Moreover, as the relief depth is increased, a greater volume of volatiles and debris are created that must be contained in an environmentally acceptable manner.

Direct laser engraving is described, for example, in U.S. Pat. Nos. 5,798,202 and 5,804,353 (both Cushner et al.) in which various means are used to reinforce the elastomeric layers. Elastomeric foams are described in similar elements in U.S. Pat. Nos. 6,090,529 and 6,159,659 (Gelbart). Engraveable elements containing hydrocarbon-filled plastic and heat-expandable microspheres are described in U.S. Patent Application Publication 2003/0180636 (Kanga et al.).

Commercial laser engraving is typically carried out using carbon dioxide lasers. While they are generally slow and expensive to use and have poor beam resolution, they are used because of the attractions of direct thermal imaging. However, it would be preferable to use infrared (IR) diodes for infrared radiation engraving that have the advantages of high resolution and relatively lower cost so that they can be used in large arrays. Other IR lasers, such as fiber lasers, are also useful. IR laser engraveable flexographic printing plate blanks having unique engraveable compositions are described in WO 2005/084959 (Figov).

Laser ablatable image transfer elements or masking elements and methods of use include the use of ablatable polymers such as poly(cyanoacrylate), polycarbonates, or polyols in combination with a colorant or pigment that can be transferred. Such elements and methods are described for example, in U.S. Pat. No. 5,605,780 (Burberry et al.), U.S. Pat. No. 5,998,088 (Robello et al.), U.S. Pat. No. 5,712,079 (Robello et al.), U.S. Pat. No. 5,156,938 (Foley et al.), and U.S. Patent Application Publication 2003/0020024 (Ferain et al.).

While there have been a number of advances in the art relating to laser-ablatable elements, there remains a need for ablatable compositions and elements that break down "cleanly" during laser imaging (or engraving) to produce fewer but identifiable components and minimal debris, thus providing better control of the imaging process and environmental and health factors. There is particularly a need for laser-ablatable elements that can be imaged in this manner to provide flexographic printing plates with sufficiently deep relief images.

SUMMARY OF THE INVENTION

The present invention provides a laser-ablatable element comprising a laser-ablatable layer having a thickness greater than 20 μm and comprising a film-forming material, wherein the film-forming material is a laser-ablatable material or the film-forming material has dispersed therein a laser-ablatable material, the laser-ablatable material being a polymeric material that when heated to 300° C. at a rate of 10° C./minute, loses at least 60% of its mass to form at least one predominant low molecular weight product.

This invention also provides a method of making a flexographic printing plate comprising:

A) providing a laser-ablatable layer having a thickness greater than 20 μm and comprising a film-forming material, wherein the film-forming material is a laser-ablatable material or the film-forming material has dispersed therein a laser-ablatable material, the laser-ablatable material being a polymeric material that when heated to 300° C. at a rate of 10° C./minute, loses at least 60% of its mass to form at least one predominant low molecular weight product, and B) imagewise directly ablating the laser-ablatable layer with a laser at an energy of at least 1 $J/cm^2$ to provide a relief image.

This invention provides a desirable method for producing relief images by laser ablation, such as providing relief images in flexographic printing plates. The laser-ablatable element includes a laser-ablatable material that can be broken down or "depolymerized" to form predominantly identifiable low molecular weight products (or monomer units in some cases) when subjected to laser imaging under conditions defined herein. The low molecular weight products produced by ablation of each laser-ablatable material can be readily captured and disposed of to reduce environmental and health hazards. In some instances, less debris (solid residue) is produced during imaging.

These advantages are achieved using the laser-ablatable material that can be a film-forming polymeric material, or it can be dispersed within a non-ablatable film-forming material in the form of fibers or particles (such as microcapsules).

DETAILED DESCRIPTION OF THE INVENTION

The term "laser-ablatable element" used herein includes any imageable element or material of any form in which a relief image can be produced using a laser according to the present invention. Examples of laser-ablatable elements include, but are not limited, to flexographic printing plate precursors and sleeve precursors, printed circuit boards, and lithographic printing plate precursors. In most instances, however, the laser-ablatable elements are used to form flexographic printing plates (flat sheets) or flexographic printing sleeves with a relief image having a depth of at least 100 μm. Such laser-ablatable elements may also be known as "flexographic printing plate blanks" or "flexographic sleeve blanks". The laser-ablatable elements can also be in the form of seamless continuous forms.

Unless otherwise indicated, when the term "laser-ablatable element(s)" is used, it is in reference to an embodiment(s) of this invention.

By "ablative", we mean that the imageable (or ablatable) layer can be imaged using a radiation source (such as a laser) that produces heat within the layer that causes rapid local changes in the imageable layer so that the imaged regions are physically detached from the rest of the layer and/or substrate and ejected from the layer. Non-imaged regions of the laser-ablatable layer are not removed or volatilized to an appreciable extent and thus form the upper surface of the relief image. In the present invention, materials are broken down into small fragments (small molecular weight compounds) that are ejected from the layer and appropriately collected. The breakdown is a violent process that includes eruptions, explosions, tearing, decomposition, fragmentation, or other destructive processes that create a broad collection of materials. This is distinguishable from, for example, image transfer. "Ablation imaging" is also known as "ablation engraving" in this art. It is also distinguishable from image transfer methods in which ablation is used to materially transfer an image by transferring pigments, colorants, or other image-forming components.

Unless otherwise indicated, the term "weight %" refers to the amount of a component or material based on the total dry layer weight of the composition or layer in which it is located.

The laser-ablatable elements can include a self-supporting laser-ablatable layer (defined below) that does not need a separate substrate to have physical integrity and strength. In such embodiments, the laser-ablatable layer is thick enough and laser ablation is controlled in such a manner that the relief image depth is less than the entire thickness, for example at least 20% but less than 80% of the entire thickness.

However, in most embodiments, the laser-ablatable elements include a suitable dimensionally stable substrate and at least one laser-ablatable layer disposed thereon. Suitable substrates include dimensionally stable polymeric films, aluminum sheets or cylinders, transparent foams, ceramics, fabrics, or laminates of polymeric films (from condensation or addition polymers) and metal sheets (such as a laminate of a polyester and aluminum sheet or polyester/polyamide laminates, or a laminate of a polyester film and a compliant or adhesive support). Polyester, polycarbonate, polyvinyl, and polystyrene films are typically used. Useful polyesters include but are not limited to poly(ethylene terephthalate) and poly(ethylene naphthalate). The substrates can have any suitable thickness, but generally they are at least 0.01 mm or from about 0.05 to about 0.3 mm thick, especially for the polymeric substrates. An adhesive layer may be used to secure the laser-ablatable layer to the substrate.

There may be a backcoat on the non-imaging side of the substrate (if present) that may be composed of a soft rubber or foam, or other compliant layer. This backcoat may be present to provide adhesion between the substrate and the printing press rollers and to provide extra compliance to the resulting printing plate.

The laser-ablatable element is positive-working whereby the imaged regions are removed with the laser-ablation. The element contains one or more layers. That is, it can contain multiple layers, at least one of which contains a laser-ablatable material as described below.

In most embodiments, the laser-ablatable layer is the outermost layer, including embodiments where the laser-ablatable layer is disposed on a printing cylinder. However, in some embodiments, the laser-ablatable layer can be located underneath an outermost capping smoothing layer that provides additional smoothness or better ink reception and release. This layer can have a general thickness of from about 1 to about 200 μm.

In general, the laser-ablatable layer has a thickness of at least 20 μm and generally from about 20 to about 3,000 μm, and typically from about 300 to about 4,000 μm.

The laser-ablatable layer includes one or more film-forming materials that are laser-ablatable materials. Alternatively, one or more laser-ablatable materials are dispersed within a film-forming material that can be a different laser-ablatable material or a non-ablatable material. Thus, in some instances, the film-forming materials are themselves "laser-ablatable", but in other instances, the laser-ablatable materials are dispersed within one or more non-ablatable or laser-ablatable film-forming materials.

Film-forming laser-ablatable materials are described in more detail below.

In some embodiments, the laser-ablatable material is in the form of microcapsules that can be dispersed within the same or different laser-ablatable material. Alternatively, laser-ablatable microcapsules can be dispersed within a non-ablatable film-forming material including such film-forming polymers as polystyrene-butadiene resins (including block styrene-butadiene-styrene copolymers), styrene-isoprene copolymers (including block styrene-isoprene-styrene copolymers), thermoplastic polyurethanes, polyurethanes, and polyisoprene, natural rubbers, ethylene-propylene diene rubbers (EPDM), neoprene/chloroprene rubbers, nitrile rubbers, and silicone rubbers.

The "microcapsules" can also be known as "hollow beads", "microspheres", "microbubbles", or "micro-balloons". Such components generally include a thermoplastic polymeric outer shell and either core of air or a volatile liquid such as isopentane and isobutane. These microcapsules include a single center core or many voids within the core. The voids can be interconnected or non-connected.

For example, non-laser-ablatable microcapsules can be designed like those described in U.S. Pat. No. 4,060,032 (Evans) and U.S. Pat. No. 6,989,220 (Kanga) in which the shell is composed of a poly[vinylidene-(meth)acrylonitrile] resin or poly(vinylidene chloride), or as plastic micro-balloons as described for example in U.S. Pat. No. 6,090,529 (Gelbart) and U.S. Pat. No. 6,159,659 (Gelbart).

Laser-ablatable microcapsules can be similarly designed but the shell is composed a laser-ablatable material as described in more detail below.

The laser-ablatable materials, whether film-forming or not, comprise at least 10 weight % and generally from about 10 to 100 weight % of the laser-ablatable layer. When the laser-ablatable materials are the predominant film-forming materials in the laser-ablatable layer, they comprise at least 50 and up to 100 weight % of that layer. When the laser-ablatable materials are used in the form of microcapsules, they are generally present in the laser-ablatable layer in an amount of at least 10 and up to about 60 weight % of that layer, wherein the microcapsules are dispersed in one or more film-forming materials comprising at least 40 weight % of the layer.

The laser-ablatable materials useful in this invention are polymeric materials that, upon heating to 300° C. (generally under nitrogen) at a rate of 10° C./minute, lose at least 60% (typically at least 90%) of their mass and form identifiable "predominant low molecular weight products" that usually have a molecular weight of 200 or less. Specific examples of ablatable material compositions are described below.

Generally, these laser-ablatable materials provide an imaging efficiency (or sensitivity) of greater than 1μ/[J/cm$^2$] and more generally greater than 1 and up to 20μ/[J/cm$^2$]. By sensitivity, we mean the depth of material removed (in μm or μ) with a given laser energy (J) per unit area (cm$^2$).

Upon laser imaging according to this invention, the ablatable material(s) in the laser-ablatable layer forms one or more predominant low molecular weight products having a molecular weight of 200 or less (typically 150 or less). By "predominant", we mean that at least 60% and typically at least 90% (by volume) of the products produced from laser-ablation imaging are the expected low molecular weight product(s) described herein. Thus, one can determine the predominant low molecular weight products by the choice of laser-ablatable materials.

Without being limited to a particular imaging mechanism for this invention, we believe that ablation of the laser-ablatable material "unzips" or "depolymerizes" the laser-ablatable polymeric material(s) in an ordered manner to produce predominantly the same low molecular weight compound(s), such as the original monomer(s) or fundamental building block(s) that were used to form the laser-ablatable material.

Laser-Ablatable Material Compositions:

In some embodiments, the laser-ablatable material is a poly(cyanoacrylate) that is a term for polymers that include recurring units derived from at least one alkyl-2-cyanoacrylate monomer and that forms such monomer as the predominant low molecular weight product during ablation. These polymers can be homopolymers of a single cyanoacrylate monomer or copolymers derived from one or more different cyanoacrylate monomers, and optionally other ethylenically unsaturated polymerizable monomers such as (meth)acrylate, (meth)acrylamides, vinyl ethers, butadienes, (meth) acrylic acid, vinyl pyridine, vinyl phosphoric acid, vinyl sulfonic acid, and styrene and styrene derivatives (such as α-methylstyrene), as long as the non-cyanoacrylate comonomers do not inhibit the ablation process.

The monomers used to provide these polymers can be alkyl cyanoacrylates, alkoxy cyanoacrylates, and alkoxyalkyl cyanoacrylates. Representative examples of poly(cyanoacrylates) include but are not limited to poly(alkyl cyanoacrylates) and poly(alkoxyalkyl cyanoacrylates) such as poly(methyl-2-cyanoacrylate), poly(ethyl-2-cyanoacrylate), poly (methoxyethyl-2-cyanoacrylate), poly(ethoxyethyl-2-cyanoacylate), poly(methyl-2-cyanoacrylate-co-ethyl-2-cyanoacrylate), and other polymers described in U.S. Pat. No. 5,998,088 (noted above) and incorporated herein by reference for the polymers described in Cols. 2-9. Methods of making these polymers are known and described for example, in U.S. Pat. Nos. 5,998,088 and 5,605,780 (noted above) and references cited therein.

Such poly(cyanoacrylates) generally have a number average molecular weight of at least 1,000 and up to about 1,000,000.

For example, laser ablation of the poly(alkyl-2-cyanoacrylate) to cause depolymerization is believed to follow the reaction shown in the following representative reaction scheme Formula (I):

Formula (I)

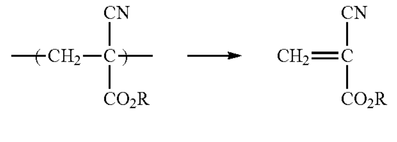

wherein R is a substituted or unsubstituted alkyl group having 1 to 20 carbon atoms, or an alkoxyalkyl group having up to 20 carbon atoms. For example, when R is methyl, the predominant low molecular weight product is methyl-2-cyanoacrylate. As one skilled in the art would appreciate, the poly(cyano acrylate) can comprise recurring units having different "R" groups as being derived from different monomers, such as poly(methyl-2-cyanoacrylate-co-ethyl-2-cyanoacrylate). Further examples of such polymers are described in U.S. Pat. No. 5,691,114 (Cols. 9-11), incorporated herein by reference.

In other embodiments, the laser-ablatable material is an alkyl-substituted polycarbonate or polycarbonate block copolymer that forms a cyclic alkylene carbonate as the predominant low molecular weight product during depolymerization from ablation. This can be represented by the following Formula (II):

Formula (II)

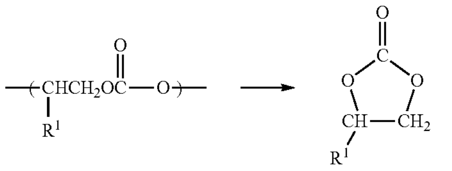

wherein $R^1$ represents a substituted or unsubstituted alkyl group having 1 to 30 carbon atoms (including linear, branched, and cyclic alkyl groups having up to 30 carbon atoms). For example, when $R^1$ is methyl, the predominant low molecular weight product formed during ablation imaging is propylene carbonate. The polycarbonate can be amorphous or crystalline, and can be obtained from a number of commercial sources including Aldrich Chemical Company (Milwaukee, Wis.). Representative polycarbonates are described for example in U.S. Pat. No. 5,156,938 (Foley et al.), Cols. 9-12 of which are incorporated herein by reference. These polymers can be obtained from various commercial sources or prepared using known synthetic methods.

In still other embodiments, the laser-ablatable material is a polycarbonate (tBOC type) that forms a diol and diene as the predominant low molecular weight products from depolymerization during ablation. This can be represented by the following Formula (III):

Formula (III)

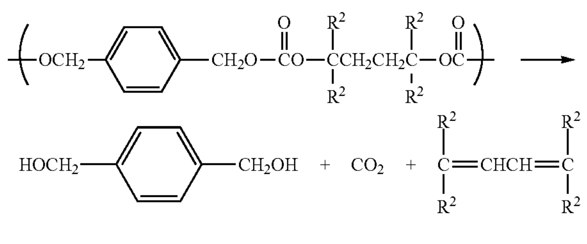

wherein $R^2$ is an alkyl group having 1 to 10 carbon atoms (including linear, branched, and cyclic alkyl groups having up to 10 carbon atoms).

Yet other embodiments include laser-ablatable materials that are polyesters that are "depolymerized" to form secondary alcohols as the predominant low molecular weight products. This can be represented by the following Formula (IV):

(IV)

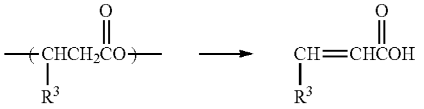

wherein $R^3$ is an alkyl group having 1 to 30 carbon atoms (including linear, branched, and cyclic alkyl groups having up to 30 carbon atoms).

The laser-ablatable layer can also comprise one or more radiation absorbing materials that absorb UV, visible, or IR radiation and transfer the exposing photons into thermal energy. Particularly useful radiation absorbing materials are infrared radiation absorbing materials that are responsive to exposure from IR lasers. Mixtures of the same or different type of infrared radiation absorbing material can be used if desired.

A wide range of infrared radiation absorbing materials are useful in the present invention, including carbon blacks and other IR-absorbing pigments (including squarylium, cyanine, merocyanine, indolizine, pyrylium, metal phthalocyanines, and metal dithiolene pigments), and metal oxides. Examples include RAVEN 450, 760 ULTRA, 890, 1020, 1250 and others that are available from Columbian Chemicals Co. (Atlanta, Ga.) as well as BLACK PEARLS 170, BLACK PEARLS 480, VULCAN XC72, BLACK PEARLS 1100.

Also useful IR absorbing compounds include carbon blacks such as carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful carbon blacks are Mogul L, Mogul E, Emperor 2000, Vulcan XC-72 and Regal 330, and 400, all from Cabot Corporation (Boston Mass.). Other useful pigments include, but are not limited to, Heliogen Green, Nigrosine Base, iron (III) oxides, transparent iron oxides, magnetic pigments, manganese oxide, Prussian Blue, and Paris Blue. Other useful IR absorbers are carbon nanotubes, such as single- and multi-walled carbon nanotubes, graphite, and porous graphite.

Although the size of the IR absorbing pigment or carbon black is not critical for the purpose of the invention, it should be recognized that a finer dispersion of very small particles will provide an optimum ablation feature resolution and ablation sensitivity. Particularly suitable are those with diameters less than 1 μm.

Dispersants and surface functional ligands can be used to improve the quality of the carbon black or metal oxide, or pigment dispersion so that uniform incorporation of the IR absorber throughout the laser-ablatable layer can be achieved.

Other useful infrared radiation absorbing materials (such as IR dyes) are described in U.S. Pat. No. 4,912,083 (Chapman et al.), U.S. Pat. No. 4,942,141 (DeBoer et al.), U.S. Pat. No. 4,948,776 (Evans et al.), U.S. Pat. No. 4,948,777 (Evans et al.), U.S. Pat. No. 4,948,778 (DeBoer), U.S. Pat. No. 4,950,639 (DeBoer et al.), U.S. Pat. No. 4,950,640 (Evans et al.), U.S. Pat. No. 4,952,552 (Chapman et al.), U.S. Pat. No. 4,973,572 (DeBoer), U.S. Pat. No. 5,036,040 (Chapman et al.), and U.S. Pat. No. 5,166,024 (Bugner et al.).

The radiation absorbing material(s) are present in the laser-ablatable element (and typically in the laser-ablatable layer)

generally in an amount of at least 1 weight %, and typically from about 2 to about 20 weight %.

In order to facilitate ablation to desired relief depth, it may be useful to include inert or "inactive" particulate materials, inert or "inactive" microspheres, a foam or porous matrix, or similar microvoids in the ablatable layer. For example, as described in U.S. Pat. No. 6,159,659 (Gelbart), inert glass or microspheres may be dispersed within the ablatable film-forming material(s). Other inert materials may be included if they contribute to a better relief image. Such inert materials do not react in any fashion and thus keep their chemical composition, but they provide centers for loosening the laser-ablatable materials upon thermal imaging, or alter the physical properties of the laser-ablatable layer in such a way that cleaner ablation edges can be obtained. Particulate additives include solid and porous fillers, which can be organic or inorganic (such as metallic) in composition. Examples of inert solid particles are silica and alumina, and particles such as fine particulate silica, fumed silica, porous silica, surface treated silica, sold as Aerosil from Degussa and Cab-O-Sil from Cabot Corporation, and micropowders such as amorphous magnesium silicate cosmetic microspheres sold by Cabot and 3M Corporation.

Inert microspheres can be hollow or filled with an inert solvent, and upon thermal imaging, they burst and give a foam-like structure or facilitate ablation of material from the laser-ablatable layer because they reduce the energy needed for ablation of the laser-ablatable material. Inert microspheres are generally formed of an inert polymeric or inorganic glass material such as a styrene or acrylate copolymer, silicon oxide glass, magnesium silicate glass, vinylidene chloride copolymers.

The microspheres should be stable during the manufacturing process of the laser-ablatable element, such as under extrusion conditions. Yet, in some embodiments, the microspheres are able to collapse under imaging conditions. Both unexpanded microspheres and expanded microspheres can be used in this invention. The amount of microspheres that may be present is from about 4 to about 40 weight % of the dry ablatable layer. Generally, the microspheres comprise a thermoplastic shell that is either hollow inside or enclosing a hydrocarbon or low boiling liquid. For example, the shell can be composed of a copolymer of acrylonitrile and vinylidene chloride or methacrylonitrile, methyl methacrylate, or a copolymer of vinylidene chloride, methacrylic acid, and acrylonitrile. If a hydrocarbon is present within the microspheres, it can be isobutene or isopentane. EXPANCEL® microspheres are commercially available from Akzo Noble Industries (Duluth, Ga.). Dualite and Micropearl polymeric microspheres are commercially available from Pierce & Stevens Corporation (Buffalo, N.Y.). Hollow plastic pigments are available from Dow Chemical Company (Midland, Mich.) and Rohm and Haas (Philadelphia, Pa.).

When unexpanded microspheres are heated during imaging, the shell softens and the internal hydrocarbon expands causing the shell to stretch and expand also. When heat is removed, the shell stiffens and the expanded microspheres remain in their expanded form. Unexpanded microspheres generally retain the same size and shape during and after imaging.

Thus, in some embodiments, the ablatable layer includes one or more film-forming laser-ablatable materials as defined above and one or more types of inert particulate materials as described above. For example, the ablatable layer can include a polycyanoacrylate mixed with EXPANCEL® microspheres or silica particles.

In other embodiments, the film-forming material in the ablatable layer is not a laser-ablatable material, but the ablatable layer includes a laser-ablatable material dispersed within a non-ablatable film-forming material. Useful non-ablatable film-forming materials that act as binders in these embodiments include but are not limited to, polystyrene-butadiene resins (including block styrene-butadiene-styrene copolymers), styrene-isoprene copolymers (including block styrene-isoprene-styrene copolymers), thermoplastic polyurethanes, polyurethanes, and polyisoprene, natural rubber, ethylene-propylene diene rubber (EPDM), neoprene/chloroprene rubbers, nitrile rubber, and silicone rubbers, and KRATON rubbers. As noted above, the laser-ablatable materials in these embodiments can be present in the form of solid or porous particles, capsules, or fibers. For example, cyanoacrylate monomers can be polymerized by a dispersion polymerization process to give a polycyanoacrylate in particulate form. Alternatively, polymers can be milled, ground or solution sprayed to give the polymer in particulate form.

In still other embodiments, the film-forming material in the laser-ablatable layer is not an laser-ablatable material, but has both laser-ablatable material(s) as described above, dispersed therein, as well as inert particulate materials or microcapsules (as described above) dispersed therein. For example, rubber polymer mixed with a combination of silica particles and polycyanoacrylate particles can be used.

Other embodiments including a first, second, and optional additional laser-ablatable materials in the ablatable layer, and these laser-ablatable materials can be film-forming materials, particulate materials or both. For example, a film-forming material is the first laser-ablatable material and has dispersed therein a second laser-ablatable material with or without inert particulate materials or microcapsules.

It may also be useful to include one or more chemicals that act as catalysts to promote depolymerization (a "depolymerization catalyst") of the laser-ablatable material(s) in the laser-ablatable layer. Such catalysts may be present in an amount of at least 0.01 weight %, and typically from about 0.1 to about 10 weight %, based on the weight of the laser-ablatable material. Examples of such chemicals include but are not limited to, acid or base generators, Lewis acids, and organometallic-based catalysts. Examples of acid generators include but are not limited to, certain IR dyes that have tosylate anion (for example IR Dye A shown in U.S. Pat. No. 7,186,482 of Kitson et al.) and ionic photo-acid generators described, for example, by Lamanna et al. in *Advances in Resist Technology & Processing XIX*, Fedynydshyn (Ed), *Proc. SPIE* Vo. 4690 (2002), and commercially available photo acid generators such as the WPAG Series available from Wako Specialty Chemicals. Examples of useful Lewis acids include but are not limited to, aluminum chloride, zinc chloride, and stannic chloride. Representative organometallic-based catalysts include but are not limited to, those described in U.S. Pat. No. 6,133,402 (Coates et al.).

Optional addenda in the ablatable layer can include but are not limited to, plasticizers, dyes, fillers, antioxidants, antiozonants, dispersing aids, surfactants, dyes or colorants for color control, and adhesion promoters, as long as they do not interfere with ablation efficiency.

The laser-ablatable element can be prepared in various ways, for example, by coating, spraying, or vapor depositing the laser-ablatable layer formulation onto the substrate out of a suitable solvent and drying. Alternatively, the laser-ablatable layer can be press-molded, injection-molded, melt extruded, or co-extruded into an appropriate layer or ring (sleeve) and adhered or laminated to the substrate and cured to form a continuous layer, flat or curved sheet, or seamless printing sleeve. The elements in sheet-form can be wrapped around a printing cylinder and fused at the edges to form a seamless printing element. Preferably, the ablatable layer is extruded in molten form unto the substrate using conventional extrusion equipment. For example, it is possible to extrude the ablatable layer formulation onto the substrate, image by laser ablation, and then use the imaged element for printing. This is a particularly useful preparatory method if the substrate is a cylinder.

The laser-ablatable element may also be constructed with a suitable protective layer or slip film (with release properties or a release agent) in a cover sheet that is removed prior to ablation imaging. Such protective layers can be a polyester film [such as poly(ethylene terephthalate)] to form a cover sheet.

A backing layer on the substrate side opposite the ablatable layer can also be present that may be reflective of imaging radiation or transparent to it.

Ablation Imaging

Ablation energy is generally applied using a suitable imaging laser such as a $CO_2$ or infrared radiation-emitting diode or YAG lasers. Ablation to provide a relief image with a depth of at least 100 μm is desired with a relief image having a depth of from about 300 to about 600 μm being desirable. The relief image may have a maximum depth up to about 100% of the original thickness of the ablatable layer when a substrate is present. In such instances, the floor of the relief image may be the substrate (if the ablatable layer is completely removed in the imaged regions), a lower region of the ablatable layer, or an underlayer such as an adhesive layer or compliant layer. When a substrate is absent, the relief image may have a maximum depth of up to 80% of the original thickness of the ablatable layer. An IR diode laser operating at a wavelength of from about 700 to about 1200 nm is generally used, and a diode laser operating at from 800 nm to 1100 nm is useful for ablative imaging in this invention.

Generally, ablation imaging is achieved using an infrared radiation laser at an energy level of at least 1 $J/cm^2$, and typically infrared imaging at from about 20 to about 1000 $J/cm^2$.

Ablation to form a relief image can occur in various contexts. For example, sheet-like elements can be imaged and used as desired, or wrapped around a printing cylinder or cylinder form before imaging. The element can also be a printing sleeve that can be imaged before or after mounting on a printing cylinder.

During imaging, most of the removed products of ablation are gaseous or volatile and readily collected by vacuum for disposal or chemical treatment. Any solid debris can be similarly collected using vacuum or washing.

After imaging, the resulting relief element can be subjected to an optional detacking step if the relief surface is still tacky, using methods known in the art.

During printing, the printing plate is inked using known methods and the ink is appropriately transferred to a suitable substrate such as paper, plastics, fabrics, paperboard, or cardboard.

After printing, the flexographic printing plate can be cleaned and reused and a printing cylinder can be scraped or otherwise cleaned and reused as needed.

The following examples are intended to illustrate the practice of this invention but are not intended to be limiting in any manner.

The samples prepared in Examples 1 and 2 were imaged with an 8 watt, 1064 nm pulsed single mode Ytterbium fiber laser with an 80 μm spot size. The image was a 1 cm×1 cm patch rastered at 800 dpi at a speed to give 38 $J/cm^2$. The depth of the ablated patch was measured with a Tencor profilometer with a 5 μm stylus.

The thermal decomposition profile was measured with a Q500 TA thermogravimetric (TGA) instrument at 10° C. per minute under nitrogen.

The samples were analyzed by Pyrolysis/Gas Chromatography/Mass Spectrometry (PY/GC/MS) at several temperatures in sequence. A small amount (0.1 mg) of each of the black polymer samples was placed in a pyrolysis tube and then pyrolyzed at a series of temperatures that included 250° C., 300° C., 350° C., 450° C., and 800° C. for sixty or twenty seconds. The volatiles from each pyrolysis were chromatographed and identified by EI MS.

Example 1

Preparation of Poly(Cyanoacrylate) Laser-Ablatable Element

A poly(ethoxyethyl-2-cyanoacrylate) solution containing a dispersion of carbon black particles was made as follows:

A vial was charged with Prism 408 (2.0 g, ethoxyethyl-2-cyanoacrylate), Mogul L carbon black (0.11 g, Cabot Corporation), and dichloromethane (5 g). The dispersion was sonicated using a commercially available horn ultrasonicator and polymerization was initiated by adding 1 drop of a solution of triethylamine (3 drops) in dichloromethane (10 ml). The resulting thick mixture was poured on a coating surface and drawn down with 40 mil (0.1 cm) shim and allowed to air dry overnight to give a smooth laser-ablatable layer on the substrate.

Pyrolysis GC/MS produced ethoxyethyl-2-cyanoacrylate monomer as the predominant low molecular weight product. Some methoxyethanol was also observed.

Example 2

Preparation of Polycarbonate Laser-Ablatable Element

Poly(propylene carbonate) (2 g, 23,000 molecular weight), obtained from Novomer (Ithaca, N.Y.) was dissolved in dichloromethane (10 g) and mixed with Mogul L carbon black (0.11 g) and a catalyst (0.10 g) of interest (shown in TABLE I below and structures thereafter). The resulting dispersion was sonicated and then evaporated to about 50% solids. The resulting thick mixture was poured onto a coating surface and drawn down with 24 mil (0.06 cm) shim and allowed to air dry overnight to give a smooth laser-ablatable layer on the substrate.

TABLE I
| Example 2 Samples | Catalyst | Structure |
|---|---|---|
| A | None | |
| B | (BP)AlOiPr | 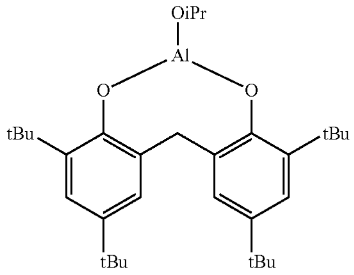 |
| C | zinc glutarate | 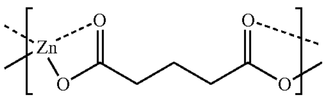 |
| D | (BDIEt)ZnOAc | 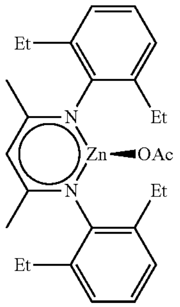 |
| E | (BDIiPr)ZnOAc | 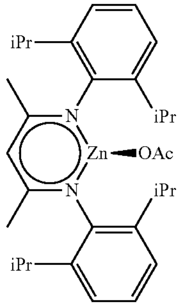 |
| F | PPNCl | $Cl^-$ $(Ph)_3P{=}N^+{=}P(Ph)_3$ |
| G | (salcy)CoOBzF5 | 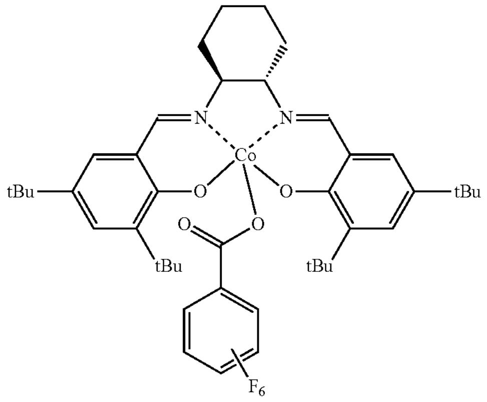 |

Propylene carbonate was the predominant low molecular weight product observed by pyrolysis GC/MS. Small amounts of acetone, propanol, allyl alcohol, propylene glycol, and intact ligand from the catalyst were also observed.

A Comparative Element was prepared similarly to Example 1 but containing styrene-butadiene-styrene block copolymer (KRATON G1780 obtained from Kraton, Houston, Tex.) as the film-forming material in the ablatable layer. This element and those described in Examples 1 and 2 were evaluated for thermal breakdown (ablation properties) by thermogravimetric analysis. The temperatures at which the ablatable layer lost 50% and 90% of its dry weight, and descriptions of the decomposition product(s) are included in TABLE II. From Samples A to G of Example 2, it was determined that propylene carbonate was produced as the predominant low molecular weight decomposition product. Small amounts of acetone, propanol, allyl alcohol, and propylene glycol were also detected. Example 1 was imaged to produce ethoxyethyl-2-cyanoacrylate as the predominant low molecular weight product. In contrast, the ablatable layer of the Comparative Element containing the KRATON block copolymer that is outside the scope of the present invention, decomposed to give a multiplicity of products, none of which was a predominant low molecular weight product. The analysis by pyrolysis GC/MS was much more complicated and showed dozens of peaks as an indication of the release of dozens of different chemical compounds.

TABLE II

| Element | Temp for 50 wt % loss | Temp for 90 wt % loss | Relief (μm) 800 dpi at 38 $J/cm^2$ | Sensitivity ($\mu/J/cm^2$) | Major product(s) |
|---|---|---|---|---|---|
| Kraton G1780 | 449 | 471 | | | Multiplicity of Products |
| Example 1 | 216 | 281 | 46 | 1.2 | Ethoxyethyl-2 cyanoacrylate |
| Example 2, Sample A | 271 | 283 | 59 | 1.6 | Propylene carbonate |
| Example 2, Sample B | No data | No data | 58 | 1.5 | No data |
| Example 2, Sample C | 257 | 266 | 64 | 1.7 | Propylene carbonate |
| Example 2, Sample D | No data | No data | No data | No data | No data |
| Example 2, Sample E | 160 | 177 | 110 | 2.9 | Propylene carbonate |
| Example 2, Sample F | 168 | 196 | 91 | 1.6 | Propylene carbonate |
| Example 2, Sample G | 250 | 268 | 60 | 1.6 | Propylene carbonate |

Example 2, Sample D, is another illustration of the use of a catalyst but no data were obtained under the conditions used in this particular example.

Example 3

Preparation of Crosslinked Polycarbonate Laser-Ablatable Element

Poly(propylene carbonate) (2.25 g, 2,300 molecular weight, two hydroxyl end groups) obtained from Novomer (Ithaca, N.Y.) was dissolved in dichloromethane (1.21 g) and mixed with Mogul L carbon black (0.148 g, Cabot Corporation) and Desmodur® N3300 triisocyanate (0.38 g). The dispersion was sonicated and the resulting thick mixture was poured onto a coating surface and allowed to dry to form a crosslinked rubber. A sample added to THF swelled two times its original volume but did not dissolve in the solvent, indicating that crosslinking had occurred.

The coated sample was successfully imaged with a series of six laser ablation processes, each in a halftone pattern of dots centered on 780 μm spacing. The dot pattern of the six ablations was in a series of increasing dot size beginning at 120 μm and progressing through 210 μm, 300 μm, 390 μm, 480 μm, and 570 μm. The exposure sequence was designed to create a pyramid shaped structure of 120 μm at the top and 570 μm at the base. Each exposure was a rastered image at 800 dpi and at a speed to generate 50 $J/cm^2$. The total exposure at the deepest point was 300 $J/cm^2$ calculated to give a relief of about 480 μm. The laser was an 8-watt, 1064 nm pulsed single mode Ytterbium fiber laser with an 80 μm spot size.

The invention has been described in detail with particular reference to certain preferred embodiments thereof, but it will be understood that variations and modifications can be effected within the spirit and scope of the invention.

The invention claimed is:

1. A laser-ablatable flexographic printing precursor comprising a laser-ablatable layer having a thickness of from about 300 to about 4,000 μm and comprising a radiation-absorbing material and a film-forming material, wherein the film-forming material is a laser-ablatable material or the film-forming material has dispersed therein a laser-ablatable material, the laser-ablatable material being a polymeric material that when heated to 300° C. at a rate of 10° C./minute, loses at least 60% of its mass to form at least one predominant low molecular weight product, and the laser-ablatable layer comprises at least 0.01 weight % of a depolymerization catalyst that is a zinc-containing organometallic based catalyst comprising a zinc center and two organic ligands.

2. The flexographic printing precursor of claim 1 wherein the laser-ablatable material has an ablation (imaging) efficiency greater than 1 $\mu/(J/cm^2)$.

3. The flexographic printing precursor of claim 1 wherein the radiation-absorbing material is a carbon black or infrared radiation absorbing dye.

4. The flexographic printing precursor of claim 1 wherein the depolymerization catalyst is one of the compounds shown in the following TABLE:

(BDIEt)ZnOAc

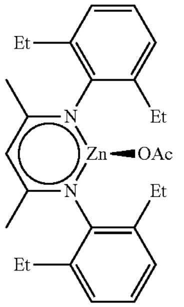

-continued (BDIiPr)ZnOAc

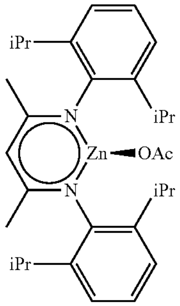

5. The flexographic printing precursor of claim 1 wherein the film-forming material is the laser-ablatable material and represents at least 10 weight % of the ablatable layer.

6. The flexographic printing precursor of claim 1 wherein the film-forming material is the laser-ablatable material and the laser-ablatable layer further comprises inactive particulate materials or microcapsules.

7. The flexographic printing precursor of claim 1 wherein the film-forming material comprises a laser-ablatable material dispersed within the film-forming material.

8. The flexographic printing precursor of claim 1 wherein film-forming material comprises the laser-ablatable material dispersed therein and the laser-ablatable layer further comprises inactive particulate materials or microcapsules dispersed therein.

9. The flexographic printing precursor of claim 1 wherein the film-forming material is a first laser-ablatable material and has dispersed therein a second laser-ablatable material.

10. The flexographic printing precursor of claim 1 wherein the film-forming material is a first laser-ablatable material and has dispersed therein a second laser-ablatable material and inactive particulate materials or microcapsules.

11. The flexographic printing precursor of claim 1 wherein the laser-ablatable layer is the outermost layer of the flexographic printing precursor and is disposed on a substrate.

12. The flexographic printing precursor of claim 1 wherein the film-forming material comprises inactive microvoided particulate materials or inert microvoided microspheres dispersed therein.

13. The flexographic printing precursor of claim 1 that is a flexographic sleeve blank or flexographic printing plate precursor.

14. The flexographic printing precursor of claim 1 wherein the laser-ablatable layer is underneath an outermost capping smoothing layer having a thickness of from about 1 to about 200 μm.

* * * * *